United States Patent
Reznikov (10) Patent No.: US 7,180,755 B1
(45) Date of Patent: Feb. 20, 2007

(54) BOARD INTERLOCK EJECTION SYSTEM

(75) Inventor: Naum Reznikov, Fremont, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 172 days.

(21) Appl. No.: 11/017,385

(22) Filed: Dec. 20, 2004

(51) Int. Cl.
H05K 7/14 (2006.01)
H05K 7/18 (2006.01)

(52) U.S. Cl. .................. 361/797; 361/798; 361/801

(58) Field of Classification Search ............. 361/797, 361/798, 801, 788, 790
See application file for complete search history.

(56) References Cited

U.S. PATENT DOCUMENTS

| | | | |
|---|---|---|---|
| 3,193,342 A | 7/1965 | Sauter | |
| 3,899,794 A | 8/1975 | Brown, Jr. | |
| 4,365,831 A | 12/1982 | Bourne | |
| 4,421,372 A | 12/1983 | Golden | |
| 4,597,173 A | 7/1986 | Chino et al. | |
| 4,778,401 A | 10/1988 | Boudreau et al. | |
| 4,872,853 A | 10/1989 | Webster | |
| 4,941,841 A | 7/1990 | Darden et al. | |
| 5,003,431 A | 3/1991 | Imsdahl | |
| 5,172,520 A | 12/1992 | Hostetler et al. | |
| 5,222,897 A | 6/1993 | Collins et al. | |
| 5,229,919 A | 7/1993 | Chen | |
| 5,255,154 A | 10/1993 | Hosoi et al. | |
| 5,332,306 A | 7/1994 | Babb et al. | |
| 5,442,513 A | 8/1995 | Lo | |
| 5,483,419 A | 1/1996 | Kaczeus, Sr. et al. | |
| 5,504,648 A | 4/1996 | Honda et al. | |
| 5,506,758 A | 4/1996 | Cromwell | |
| 5,557,499 A | 9/1996 | Reiter et al. | |
| 5,563,767 A | 10/1996 | Chen | |
| 5,653,518 A | 8/1997 | Hardt | |
| 5,654,873 A | 8/1997 | Smithson et al. | |
| 5,673,172 A | 9/1997 | Hastings et al. | |
| 5,691,859 A | 11/1997 | Ulrich et al. | |
| 5,734,557 A | 3/1998 | McAnally et al. | |
| 5,765,933 A | 6/1998 | Paul et al. | |
| 5,980,281 A | 11/1999 | Neal et al. | |
| 6,056,567 A | 5/2000 | Schell | |
| 6,067,225 A | 5/2000 | Reznikov et al. | |
| 6,193,339 B1 | 2/2001 | Behl et al. | |
| 6,252,514 B1 | 6/2001 | Nolan et al. | |
| 6,288,902 B1 | 9/2001 | Kim et al. | |
| 6,373,713 B1 | 4/2002 | Jensen et al. | |
| 6,378,965 B1 | 4/2002 | Reznikov et al. | |
| 6,413,122 B2 | 7/2002 | Fujioka | |
| 6,433,825 B1 | 8/2002 | Cama et al. | |
| 6,496,385 B1 * | 12/2002 | Smithson et al. | ........... 361/801 |
| 6,618,264 B2 | 9/2003 | Megason et al. | |
| 6,762,934 B2 | 7/2004 | Kitchen et al. | |

(Continued)

*Primary Examiner*—Hung V. Ngo
(74) *Attorney, Agent, or Firm*—Meyertons Hood Kivlin Kowert & Goetzel, P.C.; B. Noël Kivlin (57) ABSTRACT

An interlock system may control a sequence of installation of circuit board assemblies into a chassis and/or removal of the circuit board assemblies from the chassis. In one embodiment, an interlock member may inhibit installation of one circuit board assembly until another circuit board assembly has been fully installed in a chassis. An interlock member may also inhibit removal of the one circuit board assembly until another circuit board assembly has been removed. In some embodiments, an interlock member may inhibit use of injector/ejectors to inject or eject a circuit board.

20 Claims, 10 Drawing Sheets

U.S. PATENT DOCUMENTS

| | | |
|---|---|---|
| 6,795,307 B2 | 9/2004 | Arbogast et al. |
| 6,798,650 B2 | 9/2004 | Reznikov et al. |
| 6,802,117 B2 | 10/2004 | Dalisay |
| 7,027,309 B2 * | 4/2006 | Franz et al. ................ 361/798 |
| 7,070,431 B1 * | 7/2006 | White ........................ 439/160 |
| 7,075,796 B1 * | 7/2006 | Pritchett ..................... 361/796 |
| 2003/0231476 A1 * | 12/2003 | Vinson et al. .............. 361/798 |

* cited by examiner

BOARD INTERLOCK EJECTION SYSTEM

BACKGROUND OF THE INVENTION

1. Field of the Invention

This invention relates generally electronic equipment, such as computers, and, more particularly, to apparatus used during insertion and extraction of circuit boards from electronic systems.

2. Background Information

Electronic systems such as computers are typically constructed in a modular fashion from circuit boards, each circuit board generally performing a specific function. Each circuit board requires multiple electrical connections, which are generally provided by two part multi-contact electrical connectors. One part of the connector is mounted to the circuit board, while a mating part of the connector may be attached to another component of the system such as a rack, a chassis, a cable, or another circuit board (e.g., backplane circuit board). Successful mating of connector parts is needed for reliable electrical connections in the system.

A number of mechanisms are known for injecting a circuit board into a chassis or extracting a circuit board from a chassis. Such mechanisms may include lever arms pivotally coupled to the circuit board and arranged to engage projections formed on the chassis. Guide formations may be provided on the chassis to receive the circuit board and to guide the circuit board into position such that electrical connector parts mate with one another. The lever arms may be arranged on the circuit board such that when the lever arms are actuated, the circuit board is provided with a biasing force that serves to move the circuit board toward the rear of the chassis, thereby mating the parts of the electrical connector.

For circuit boards with connectors having a relatively large number of pins, large insertion forces may be required to mate the connector parts. For example, a large board may contain several multi-contact connectors, each connector containing several hundred individual contacts. Each contact requires the application of an insertion force to seat the contact. Thus, the total insertion force required to seat a large board may be 65 pounds or more. Moreover, individual contacts are easily damaged if the mating connector parts are not properly aligned when they come into contact with each other. This problem is especially acute where large forces are required to mate the connector parts.

Typically, a system may include multiple circuit boards that are installed in a parallel spaced relationship to one another. In some cases, the parallel circuit boards may be commonly coupled to another circuit board (e.g., a backplane). The commonly coupled circuit board may provide electrical connections between motherboards.

It is sometimes advantageous to specify an order of installation of circuit boards into a system and an order of removal of circuit boards from the system. For example, it may be desirable to install a motherboard on a backplane before installing a daughterboard on the motherboard, or to remove a daughterboard from a motherboard before removing the motherboard from a backplane. In addition, it may be desirable to ensure that one circuit board (e.g., a motherboard) is fully installed before another circuit board (e.g., a daughterboard) is installed. For example, if a motherboard is not fully installed when a daughterboard is coupled to the motherboard, both the motherboard and the daughterboard may end up in an improper position relative to other components of the system (e.g., other circuit boards, chassis walls, etc.) In some case, improper positioning of a circuit board may cause misalignment or interference of the circuit board relative to other components, which may damage the circuit board or other components. User documentation such as service manuals may provide detailed instructions to promote proper installation and removal of circuit boards, and in the proper sequence. In addition, circuit board assemblies may themselves have labels displaying instructions for proper installation and removal the circuit boards. In practice, however, personnel may fail to review or correctly implement such instructions.

SUMMARY OF THE INVENTION

In an embodiment, an interlock system may control a sequence of installation of circuit board assemblies into a chassis and/or removal of the circuit board assemblies from the chassis. The interlock system may include an interlock member that engages elements of the circuit board assemblies. In one embodiment, the interlock member may inhibit installation of one circuit board assembly until another circuit board assembly has been fully installed in a chassis. An interlock member may also inhibit removal of one circuit board assembly until another circuit board assembly has been removed.

In an embodiment, an interlock system may selectively inhibit use of injector/ejectors on one or more circuit board assemblies. An interlock member may engage an injector/ejector on one or more of the circuit board assemblies. When the interlock member is engaged with the injector/ejector, the interlock member may inhibit use of the injector/ejector to inject or eject a circuit board. In some embodiments, the interlock system may include a manual release to release the injector/ejector from engagement with the injector/ejector. In certain embodiments, the injector/ejector may be releasable only after another circuit board is removed.

In an embodiment, a computer system may include a plurality of motherboard assemblies in a chassis. The computer system may also include a side panel assembly that couples to receptacles on each of the motherboard assemblies. The motherboard assemblies may include interlock mechanisms. The interlock mechanisms may inhibit installation of the side panel assembly unless all the motherboard assemblies in the chassis are fully installed. The interlock mechanisms may also inhibit removal of the motherboard assemblies when the side panel assembly is installed.

In one embodiment, a motherboard assembly may include left and right motherboard injector/ejectors and left and right interlock members. The interlock members may engage the motherboard injector/ejectors when the motherboard injector/ejectors have been actuated to inject the motherboard assembly into the chassis. Once the motherboard assembly has been injected, the interlock members may inhibit use of the motherboard injector/ejectors to eject the motherboard assembly from the chassis until a release is operated. In certain embodiments, when the interlock members are engaged with the motherboard injector/ejectors, the interlock members may be positioned to allow installation of a side panel assembly on the motherboard assembly. When the interlock members are not engaged with the motherboard injector/ejectors, the interlock members may be positioned to inhibit installation of a side panel assembly on the motherboard assembly.

When the side panel assembly is installed on the motherboard assembly, the lock pins may inhibit movement of the interlock members such that the interlock members remain engaged with the motherboard injector/ejectors. When the side panel assembly is not installed on the motherboard assembly, releases may be operated to disengage the interlock members from the motherboard injector/ejectors, thereby allowing the motherboard injector/ejectors to be used to eject the motherboard assembly.

In an embodiment, an interlock mechanism may be used to control a sequence of installation or removal of circuit board assemblies mounted in parallel in a chassis. The first circuit board assembly to be installed may include interlock members. The second circuit board assembly to be installed may include lock pins that engage the interlock members when the second circuit board assembly is installed in the chassis. The interlock members on the first circuit board assembly may inhibit installation of the second circuit board assembly (e.g., by inhibiting advancement of the lock pins) unless the first circuit board assembly is fully installed in the chassis. The lock pins on the second circuit board assembly may engage the interlock members to inhibit release of the first circuit board assembly (e.g., by inhibiting use of injector/ejectors on the first circuit board assembly) when the second circuit board assembly is installed in the chassis.

BRIEF DESCRIPTION OF THE DRAWINGS

Other aspects of the invention will become apparent upon reading the following detailed description and upon reference to the accompanying drawings in which.

While the invention is susceptible to various modifications and alternative forms, specific embodiments thereof are shown by way of example in the drawings and will herein be described in detail. It should be understood, however, that the drawings and description thereto are not intended to limit the invention to the particular form disclosed, but, on the contrary, the invention is to cover all modifications, equivalents, and alternatives falling with the spirit and scope of the present invention as defined by the appended claims.

DETAILED DESCRIPTION OF THE INVENTION

A computer system may include components installed in a chassis or rack assembly. As used herein, "chassis" includes any structure that supports or houses one or more elements of a computer system (e.g., electronic modules). A component may be supported in a chassis by various structures including, but not limited to, slides, rails, a shelf, or a bottom wall of a chassis.

As used herein, "circuit board" includes any assembly or structure that includes or carries electrical components (including, but not limited to, semiconductor devices, resistors, capacitors, relays, switches, and connectors) or conductors (e.g., wires, traces) for an electrical system. "Circuit board" includes, but is not limited to, a printed circuit board made of epoxy-glass and metal layers. As used herein, "component" includes any element of system, including, but not limited to, a power supply, a disk drive, or a printed circuit board. As used herein, "motherboard" includes any circuit board that receives one or more other circuit boards or plug-in components.

Figure 1:
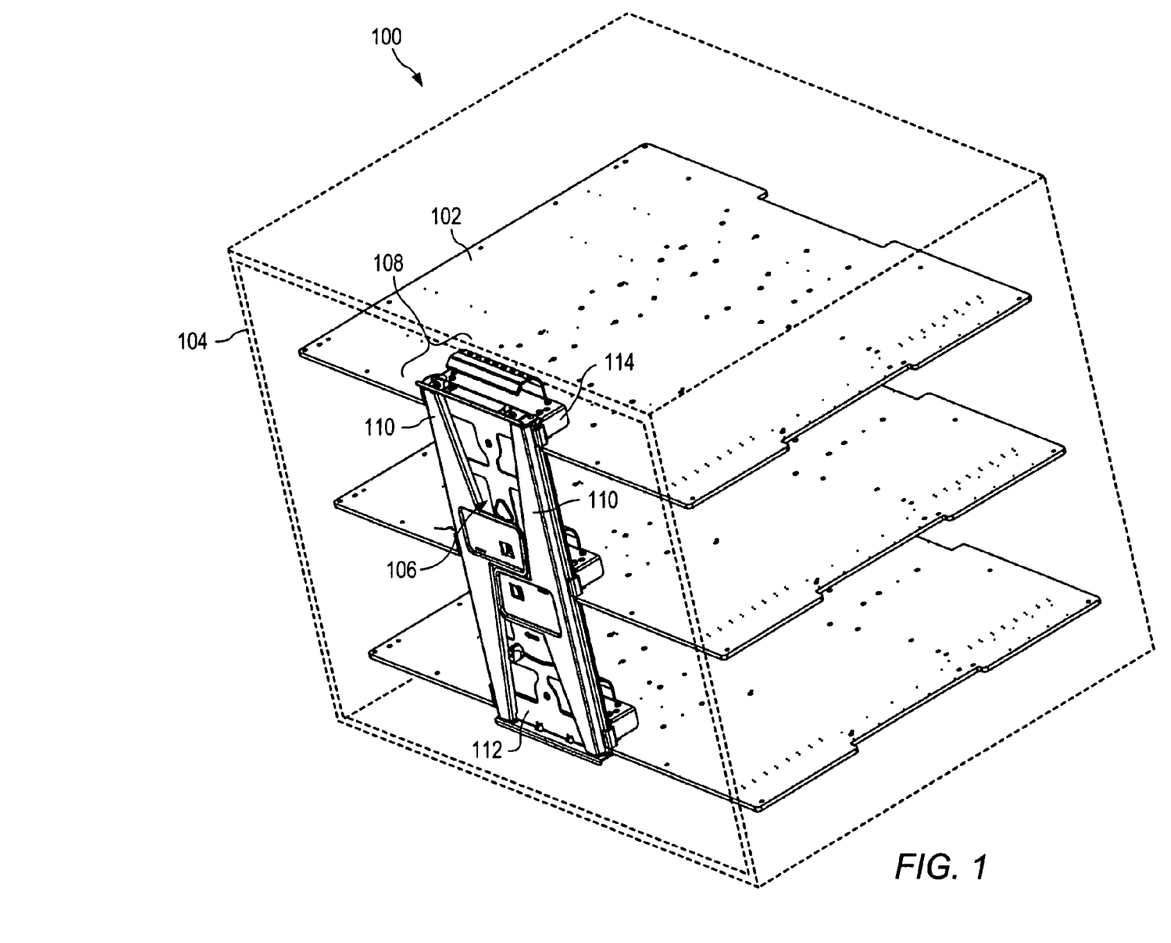
FIG. 1 depicts a system including parallel spaced motherboards and a side panel assembly.

FIG. 1 depicts computer system 100 including motherboards 102 in chassis 104. Motherboards 102 may be mounted in chassis 104 by rails, slides, card guides, or other mounting hardware. In some embodiments, motherboards 102 may be coupled to a common backplane circuit board near a rear of the chassis.

Computer system 100 may include side panel assembly 106. Side panel assembly 106 may be removably coupled to one or more of motherboards 102. Side panel assembly 106 may provide electrical and optical connections between motherboards 102 and/or between the motherboards 102 and external components. Side panel assembly 106 may include a circuit board with header connector parts. Motherboards 102 may include receptacles 108. Receptacles 108 on motherboards 102 may include receptacle connector parts. The receptacle connector parts in receptacles 108 on may mate with the header connector parts on side panel assembly 106. In some embodiments, a side panel assembly may serve as a bridgeboard between two or more adjacent circuit boards. Side panel assemblies may provide for more efficient routing in a system (e.g., allow for shorter paths between components) than may be achieved with a single backplane or external cabling.

Figure 2:
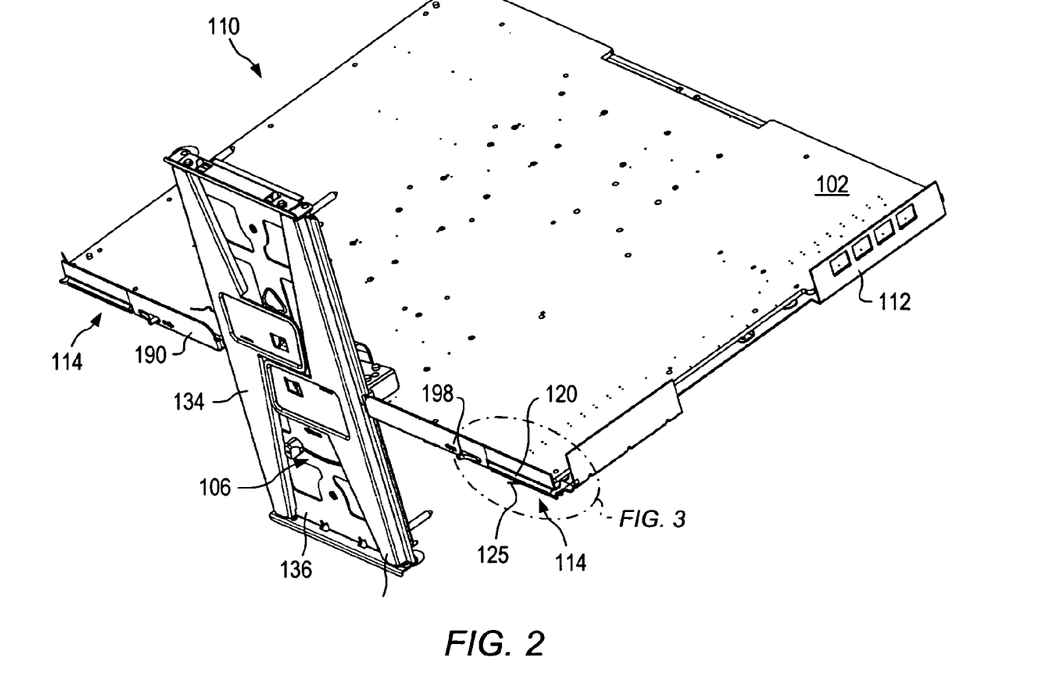
FIG. 2 depicts a perspective view of a motherboard assembly including injector/ejectors and interlock mechanisms, coupled to a side panel assembly.

FIG. 2 depicts a perspective view of motherboard assembly 110 coupled to side panel assembly 106. Motherboard assembly 110 may include motherboard 102 and motherboard support 112. Motherboard support 112 may provide structural support for motherboard 102 during installation and handling of motherboard 102 and reduce displacement of components on motherboard 102 when motherboard 102 is subjected to shock and vibration loads during use.

As shown in FIG. 2, motherboard assembly 110 may include motherboard injector/ejectors 114. Motherboard injector/ejectors 114 may be operated to couple and decouple motherboards 102 to and from chassis 104. As used herein, "injector/ejector" includes any element that may be used to inject a component into a system, eject a component from a system, or both. As used herein, to "inject" generally means to couple a component to a system or another component. "Injecting" a circuit board may include, but is not limited to, advancing a circuit board to couple a connector part on the circuit board with a mating connector part on another component (e.g., a backplane). As used herein, to "eject" generally means to decouple a component from a system or another component. "Ejecting" a circuit board may include, but is not limited to, withdrawing a circuit board to decouple a connector part on the circuit board from a mating connector part on another component (e.g., a backplane). Examples of injector/ejector devices include, but are not limited to, levers, screws, rods, cams, hooks, or pins. As shown in FIG. 2, in some embodiments, injector/ejectors may be provided on each of the left and right sides of a circuit board. In other embodiments, an injector/ejector may be provided in other locations (e.g., the center of a circuit board, or on only one side of a circuit board).

Figure 3:
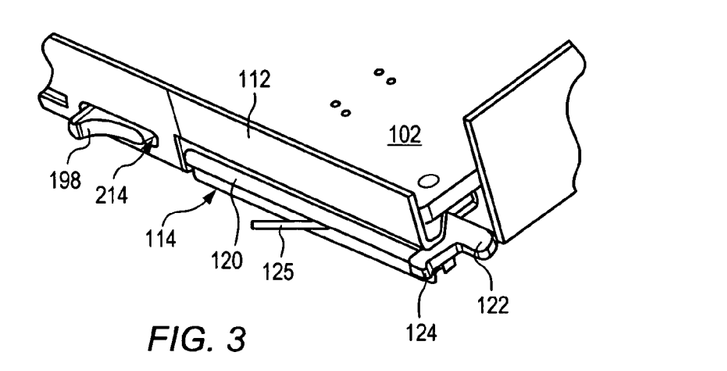
FIG. 3 depicts a detail view of the injector/ejector as shown in FIG. 2.

FIG. 3 depicts a detail view of motherboard injector/ejector 114 on motherboard assembly 110. Motherboard injector/ejector 114 may pivotally couple with motherboard support 112. Motherboard injector/ejector 114 may include handle 120, inject portion 122, and eject portion 124. Torsion spring 125 may bias handle 120 of motherboard injector/ejector 114 away from motherboard 102. Chassis 104 (shown in FIG. 1) may include a projection that is fixed with respect to the chassis structure. As further described herein, motherboard injector/ejector 114 may be selectively actuated to engage the projection on chassis 104. When motherboard injector/ejector 114 is rotated toward chassis 104 (as indicated by the dashed lines shown in FIG. 9), inject portion 122 of motherboard injector/ejector 114 may engage the projection such that motherboard assembly 110 is drawn into chassis 104. When motherboard injector/ejector 114 is rotated away from chassis 104, eject portion 124 of motherboard injector/ejector 114 may engage the projection such that motherboard assembly 110 is pushed out of chassis 104.

Figure 4:
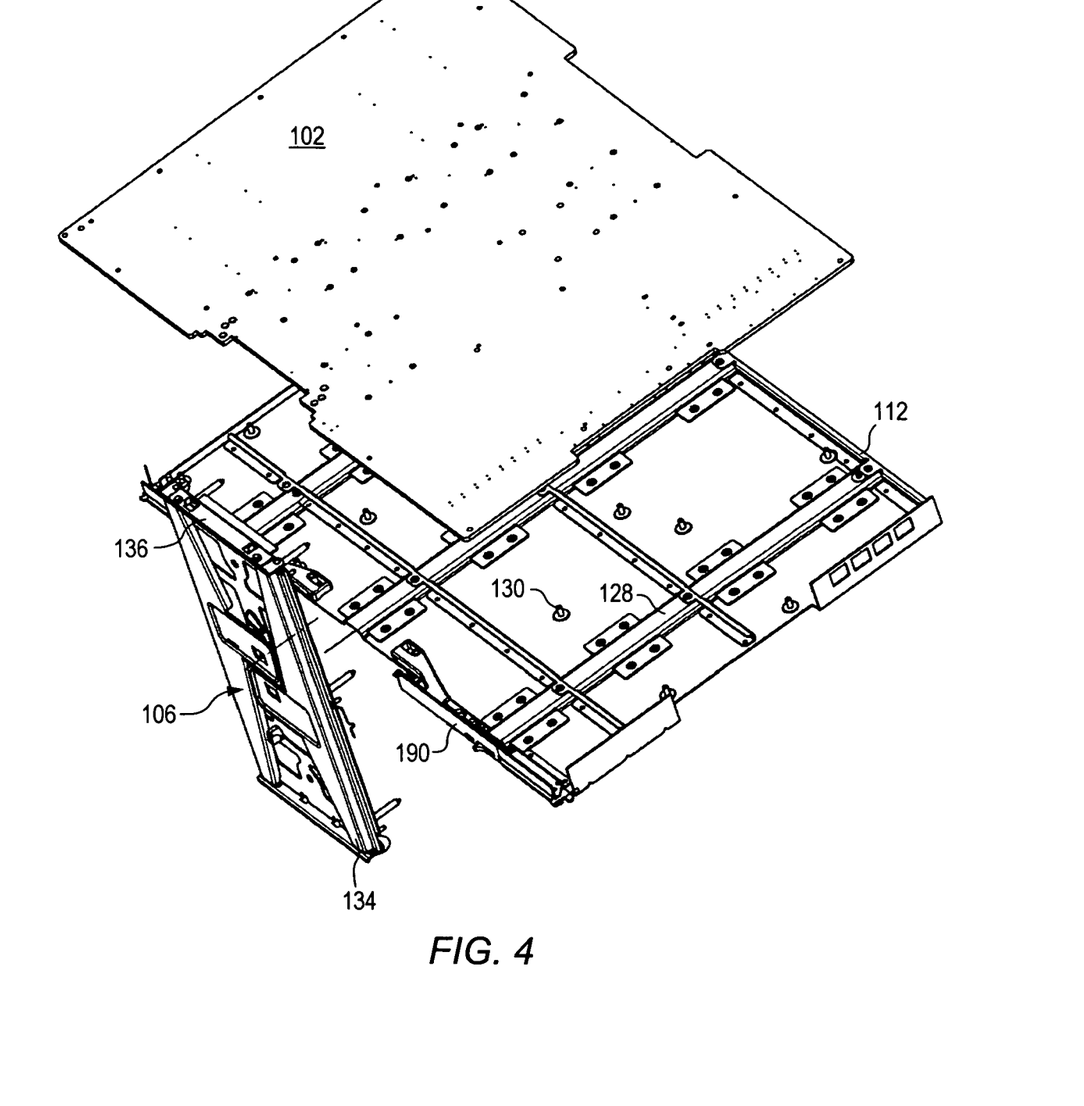
FIG. 4 depicts a partially exploded view of a motherboard assembly and side panel assembly.

FIG. 4 depicts a partially exploded view of motherboard assembly 110 with side panel assembly 106 removed. Motherboard support 112 may include stiffeners 128 and spacers 130. Motherboard 102 may be mounted on spacers 130.

Referring again to FIG. 2, side panel assembly 106 may include side panel injector/ejectors 134. Side panel injector/ejectors 134 may be operated to selectively inject and eject side panel assemblies 106 to and from one or more motherboard assemblies 110. Side panel injector/ejectors 134 may pivotally couple to base plate 136 on side panel assembly 106.

Figure 5:
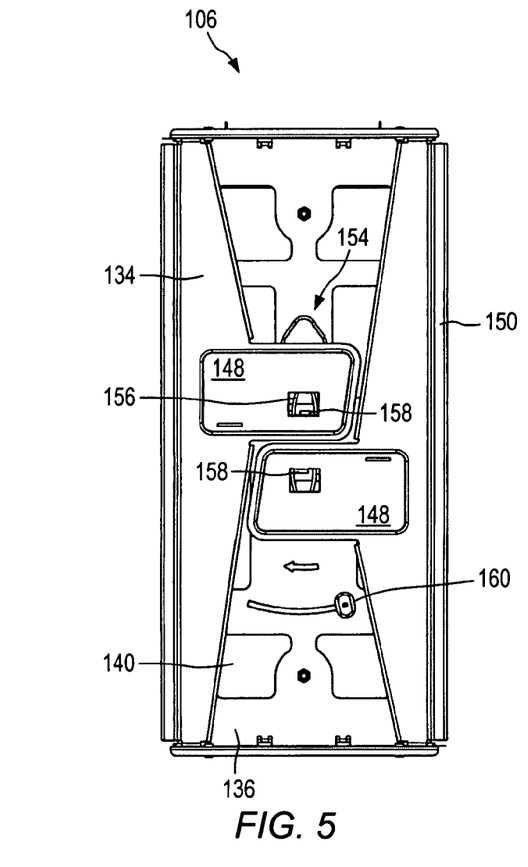
FIG. 5 depicts a front view of a side panel assembly including a pair of injector/ejectors.
Figure 6:
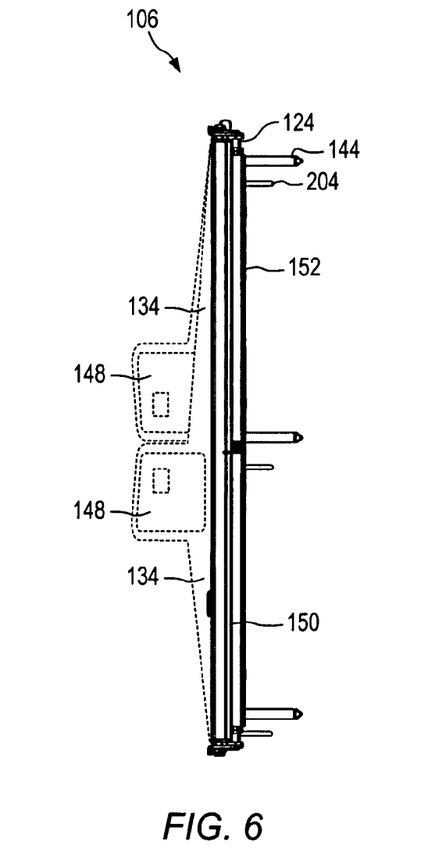
FIG. 6 depicts a side view of a side panel assembly including a pair of injector/ejectors.
Figure 7:
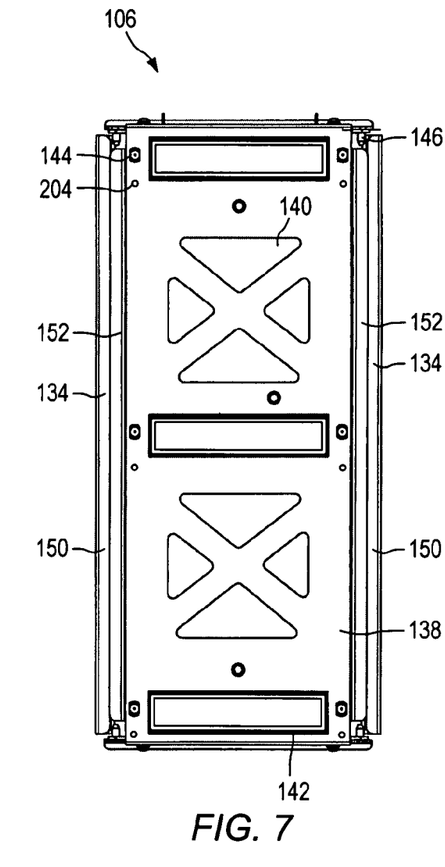
FIG. 7 depicts a rear view of a side panel assembly including header connector parts and injector/ejectors.

FIG. 5 depicts a front view of side panel assembly 106. FIG. 6 depicts a side view of side panel assembly 106. FIG. 7 depicts a rear view of side panel assembly 106. As shown in FIG. 7, side panel assembly 106 may include bottom plate 138. Header circuit board 140 may be provided between base plate 136 and bottom plate 138. Header connector parts 142 may be included on header circuit board 140. Header connector parts 142 may include electrical contacts (e.g., pins, sockets, or a combination of both) and/or optical contacts (e.g., fiber optic termini). Side panel assembly 106 may include guide pins 144. Guide pins 144 may facilitate alignment of side panel assembly 106 with receptacles 108 (shown in FIG. 1).

Side panel injector/ejectors 134 may be pivotally attached to the left and right sides of base plate 136 on hinge pins 146. Side panel injector/ejectors 134 may include handle portions 148 and projecting rims 150. Projecting rims 150 may engage portions of receptacles 108 during injection and/or ejection of side panel assembly 106. Examples of other types of engaging members that may be used for an inject/eject mechanism include, but are not limited to, hooks, tabs, cams, screws, bolts, or pins. Base plate 136 may include stops 152. Projecting rims 150 may contact stops 152 to limit rotation of side panel injector/ejectors 134. In some embodiments, as shown in FIG. 1, a single side panel injector/ejector on a side panel assembly may engage multiple receptacles. In other embodiments, a side panel assembly may include one or more separate side panel injector/ejectors for each receptacle.

In some embodiments, an inject/eject mechanism for a circuit board may include a latch device. The latch device may hold one or more injectors/ejectors of an inject/eject mechanism in a closed position. A latch for a latch device may be of various types, including, but not limited to, a push knob latch, coil spring latch, or touch latch. As shown in FIG. 5, side panel assembly 106 may include latch device 154. Latch device 154 may include latch spring 156. Latch spring 156 may be attached to base plate 136. Latch spring 156 may resiliently engage catches 158 on injectors 134 when injectors 134 are closed against base plate 136. Side panel assembly 106 may include release 160. Release 160 may be operated to release latch spring 156 to allow side panel injector/ejectors 134 to be rotated away from base plate 136. FIG. 6 shows in dashed lines a pair of injectors in a partially open position after latch spring 156 has been released.

Figure 8:
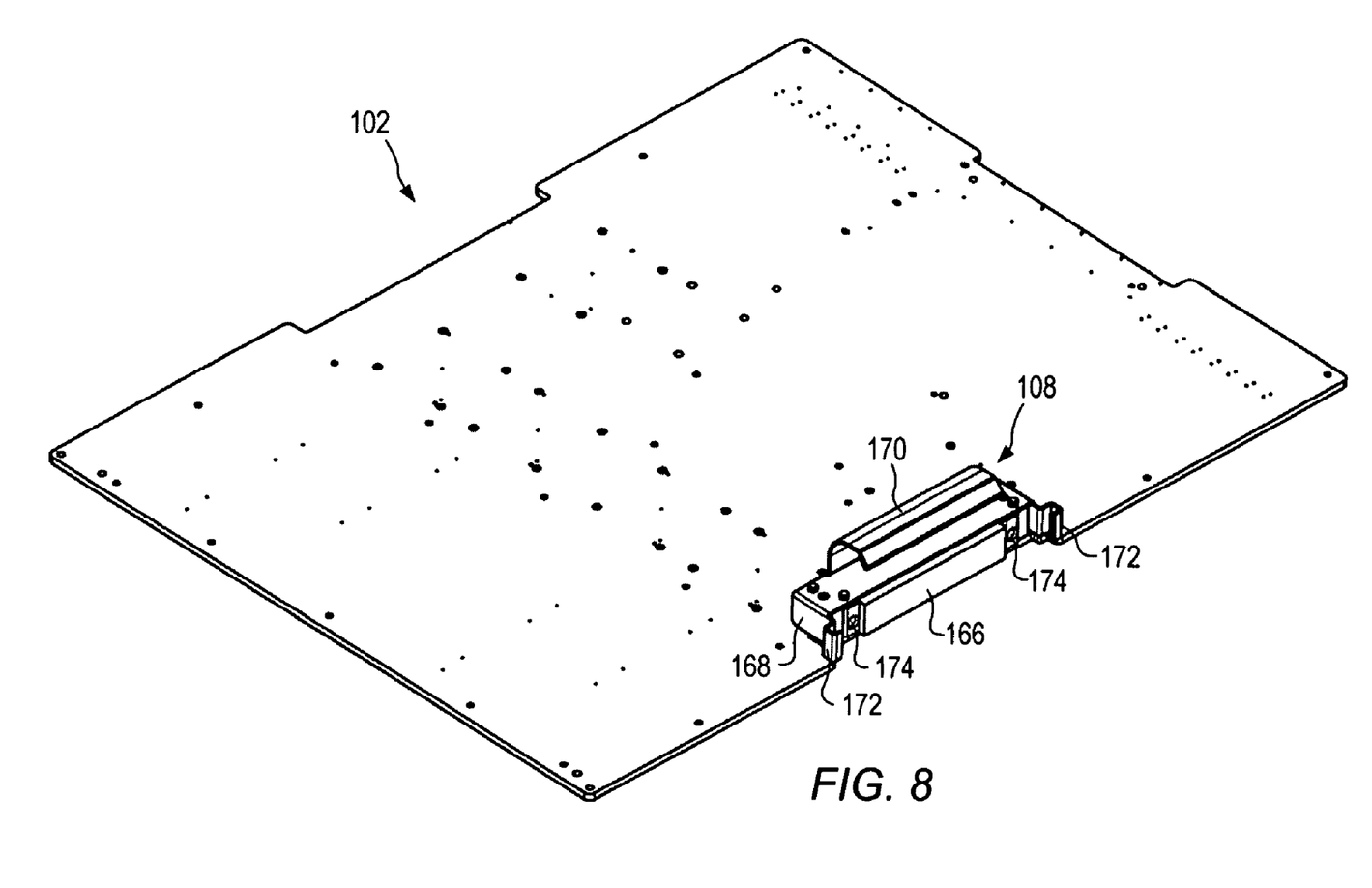
FIG. 8 depicts a motherboard including a receptacle for a side panel assembly.

FIG. 8 depicts a detail view of receptacle 108 on motherboard 102. Receptacle 108 may include receptacle connector part 166. Receptacle connector part 166 may be mounted on bracket 168. Receptacle connector part 166 may include electrical contacts (e.g., pins, sockets, or a combination of both) and/or optical contacts. Contacts in receptacle connector part 166 may be complementary to those of a corresponding header connector part.

Bracket 168 may include carrying handle 170. Carrying handle 170 may be used to facilitate installation and/or maintenance of motherboard 102. Carrying handle may reduce a risk of user contact with active components on motherboard 102. In one embodiment, bracket 168 is made of cold rolled steel. Bracket 168 may be made of various other materials, including, but not limited to, stainless steel, aluminum, or a polymer (e.g., polyvinyl chloride, ABS).

Bracket 168 may include hooks 172. Hooks 172 may engage with a portion of an injector/ejector on side panel assembly 106 (shown in FIG. 1) to facilitate injection and/or ejection of the side panel assembly. Hooks on a receptacle may have any of a variety of shapes, including, but not limited to, a "C"-shape, an "L"-shape, or an arc shape. A receptacle may include various other elements for engaging a portion of an injector, including, but not limited to, tabs, apertures, rings, or loops.

Receptacle 108 may include guide holes 174. In some embodiments, guide holes 174 may be fitted with bushings 176. Guide holes 174 may receive guide pins 144 (shown in FIG. 6) on side panel assembly 106. Guide pins 144 and guide holes 174 may facilitate proper alignment of the respective electrical contacts in header connector part 142 and receptacle connector part 166. Proper alignment of electrical contacts between a receptacle connector part and a header connector part may reduce a risk of damage to contacts during installation of a side panel assembly. In some embodiments, tolerances between guide pins and guide holes may be controlled to establish a close fit between the guide pins and the guide holes. Guide pins may carry some of the mechanical loads (e.g., vibration loads) between parts of a connector, reducing loads on electrical contacts in the connector.

In some embodiments, a computer system may include an interlock system. The interlock system may include one or more interlock mechanisms. As used herein, "interlock" or "interlocking" includes, but is not limited to, connecting two or more elements of a system such that the position or orientation of one element affects motion or operation of another element. For example, an interlock mechanism may inhibit motion of a first element when a second element is in a predetermined position. In some embodiments, a position or orientation of two elements may mutually affect motion or operation of each other. In some embodiments, an interlock mechanism may ensure that elements of a system (e.g., circuit boards) are installed and/or removed in a correct sequence. In other embodiments, an interlock mechanism may ensure that elements of a system (e.g., circuit boards) are in a desired position when other elements of the system (e.g., other circuit boards) are installed. In certain embodiments, an interlock mechanism may selectively engage portions of an injector/ejector to inhibit operation of the injector/ejector until elements of the system are properly positioned (e.g., inhibiting insertion of a daughterboard or side panel circuit board until a motherboard is fully installed in a chassis.)

An interlock mechanism may include one or more interlock members. An interlock member may engage elements of the system (e.g., injector/ejector levers) to selectively inhibit or allow movement of one or more elements. As used herein, "engage" or "engaging" includes any condition in which one element engages (e.g., contacts) another element during operation or use of an apparatus. Examples of interlock members include, but are not limited to, a slide, a lever, a screw, a bar, a rod, a shaft, or a combination thereof. Portions of an interlock member may be straight and/or curved, flexible and/or rigid, or a combination thereof. In some embodiments, an interlock member may be a unitary member (e.g., a single molded piece). In other embodiments, an interlock member may include multiple members (e.g., a linkage of two or more rods).

Figure 9:
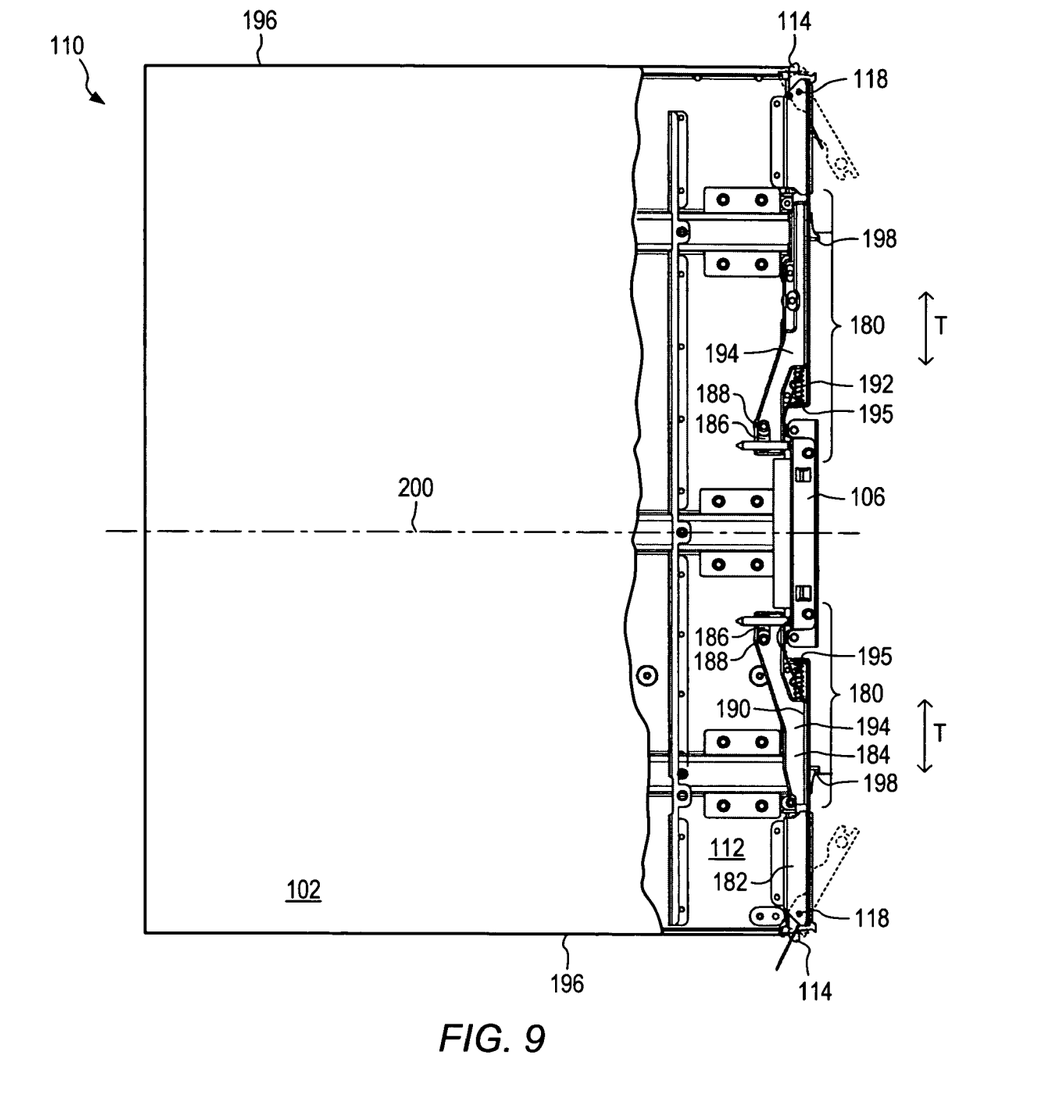
FIG. 9 depicts a top view of a side panel assembly coupled to a motherboard assembly including interlock mechanisms.

FIG. 9 depicts a top view of motherboard assembly 10 having an interlock mechanism 180, with side panel assembly 106 installed on the motherboard assembly. In FIG. 9, motherboard 102 has been partially cut away to reveal portions of interlock mechanism 180. Injector/ejector brackets 182 on motherboard support 112 may pivotally support motherboard injector/ejectors 114 at pivot pins 118. Interlock mechanism 180 may include left and right interlock members 184. Interlock members 184 may be coupled to motherboard support 112. Interlock members 184 may be movable in lateral directions relative to motherboard 102, as indicated by arrows T. Interlock members 184 may include guide slots 186. Guide slots 186 may receive guide pins 188 on motherboard support 112. In some embodiments, interlock members 184 may be partially guided by a rear wall of front panel 190 of motherboard support 112. Interlock members 184 may also be guided by structural members (e.g., blocks, posts) mounted on motherboard support 112 behind interlock members 184 (e.g., guide block 189 shown in FIG. 14). In certain embodiments, the underside of motherboard 102 may contact interlock members 184 to help retain interlock members 184 in position on motherboard support 112. Although the interlock members 184 in the embodiment shown in FIG. 9 are supported by motherboard support 112, it will be understood that in other embodiments interlock members 184 may be supported by other structures, such as front rails or guides.

Compression springs 192 may be located between bodies 194 of interlock members 184 and rim 195 of front panel 190. Compression springs 192 may bias interlock members 184 toward lateral sides 196 of the motherboard. Interlock members 184 may selectively engage portions of motherboard injector/ejectors 114 and side panel assembly 106. Interlock members 184 may include release 198. Release 198 may be operated by a user (e.g., by pressing with the user's thumb) to manually retract interlock members 184 toward centerline 200 of motherboard 102.

Motherboard assembly 110 may provide limits on lateral movement of interlock members 184. In some embodiments, lateral travel of interlock members 184 may be limited by contact of one of guide pins 188 with the ends of a corresponding guide slot 186. In other embodiments, lateral movement of interlock members 184 may be limited by contact of release 198 with the sides of front panel slot 214 (see FIG. 2). In one embodiment, a range of lateral movement of each of the left and right interlock members may be about 5 mm.

Figures 10, 11, 12:
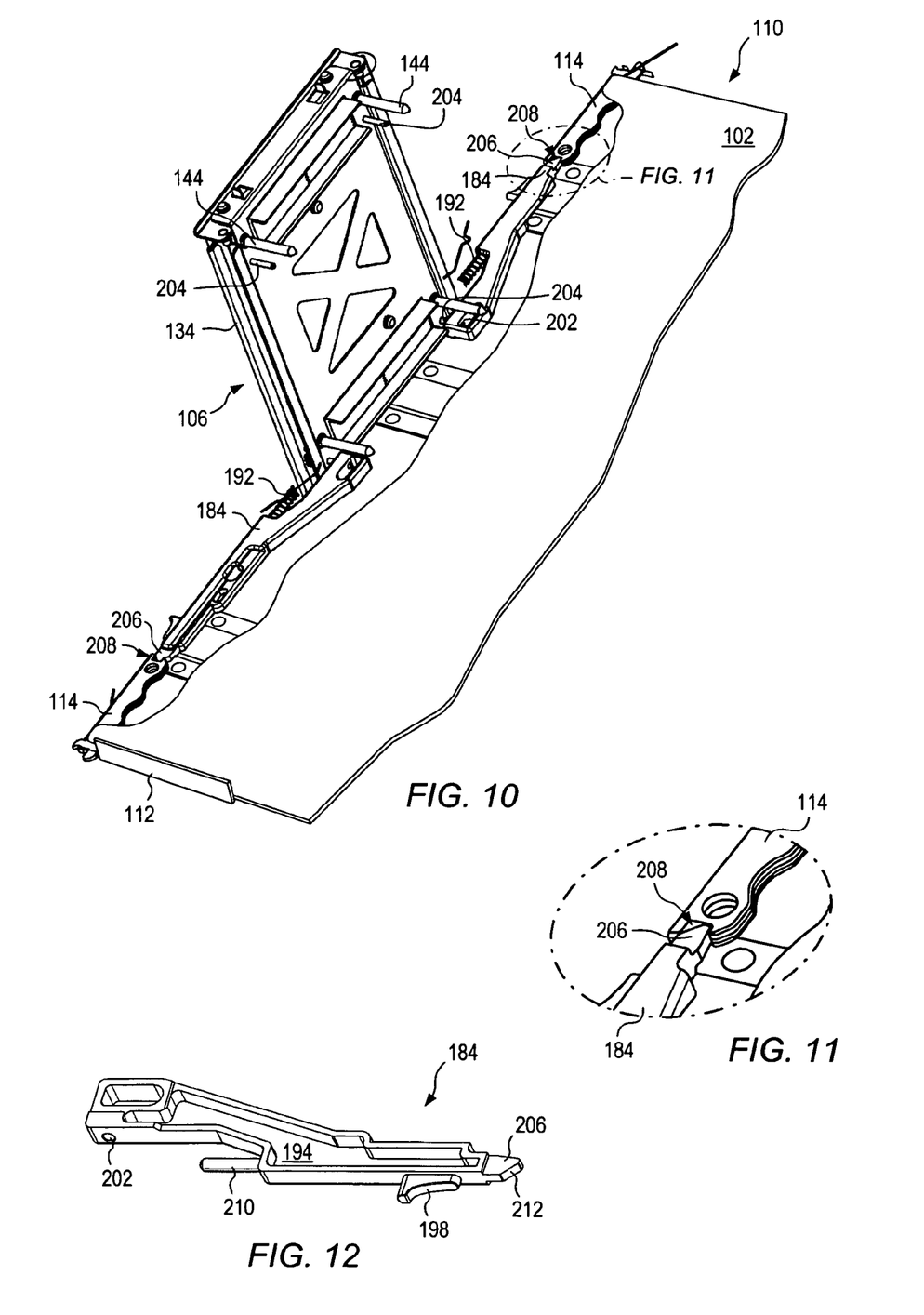
FIG. 10 depicts a perspective view of a side panel assembly coupled to a motherboard assembly including interlock mechanisms.
FIG. 11 depicts a detail view of an interlock member and injector/ejector as shown in FIG. 10.
FIG. 12 depicts an interlock member.

FIG. 10 depicts a perspective view of motherboard assembly 110 including interlock members 184. Side panel assembly 106 is shown installed on motherboard assembly 110. In FIG. 10, portions of motherboard 102, including receptacle 108, and motherboard support 112 have been cutaway for clarity. Interlock members 184 may include engaging portions 206. Engaging portion may engage notches 208 in motherboard injector/ejectors 114 to inhibit rotation of motherboard injector/ejectors 114 when the motherboard injector/ejectors 114 are in a closed position.

Interlock members 184 may include holes 202. Holes 202 may be sized to receive lock pins 204 on side panel assembly 106. Holes 202 and lock pins 204 may have any of various complementary shapes and sizes, including, but not limited to, round, square, diamond-shaped, hexagonal, or hexalobular. When motherboard injector/ejectors 114 are placed in an open position (e.g., rotated away from motherboard 102), compression spring 192 may urge interlock members 184 away from centerline 200 of motherboard 102 until interlock members reach a stop on motherboard assembly 110 (e.g., when release 198 reaches an exterior edge of front panel slot 214, as shown in FIG. 2). When interlock members 184 are against the stops, holes 202 in interlock members 184 may be offset laterally from the axes of lock pins 204 toward lateral sides 196.

When motherboard injector/ejectors are placed in a closed position, engaging portions 206 of interlock members 184 may engage in notches 208 in motherboard injector/ejectors 114, as shown in FIG. 11). When engaging portions 206 of interlock members 184 are engaged in notches 208, holes 202 may be axially aligned with lock pins 204 on side panel assembly 106. Alignment of holes 202 with lock pins 204 may allow lock pins 204 to be received in holes 202 when side panel assembly 106 is placed against motherboard assembly 110, as shown in FIG. 10. Engagement of lock pins 204 in holes 202 may inhibit movement of interlock members 184. While side panel assembly 106 is installed on motherboard assembly 110, engagement of interlock members 184 of engaging portions 206 in notches 208 may inhibit motherboard injector/ejectors 114 from being rotated away from motherboard 102.

When side panel assembly 106 is not installed on motherboard assembly 110, releases 198 may be operated to move interlock members 184 toward centerline 200 of motherboard 102. Interlocking members 184 may be disengaged from motherboard injector/ejectors 114, allowing motherboard injector/ejectors 114 to rotate with respect to motherboard 102. While releases 198 in the embodiment shown are manually actuated, in other embodiments the releases may automatically actuated. Releases may be actuated by hand or using various devices, including, but not limited to, hand tools power tools, or solenoid devices.

In the embodiment shown in FIG. 10, interlock members 184 translate in a lateral direction relative to motherboard 102. It will be understood, however, that in other embodiments, the motion of an interlock member may take various other forms. For example, an interlock member may from translate from front to back with respect to the circuit board, or rotate with respect to the circuit board, or a combination of both.

FIG. 12 depicts a perspective view of interlock member 184. Interlock member 184 may include spring post 210. Spring post 210 may protrude from body 194. Spring post 210 may maintain compression spring 192 in a proper working relationship relative to body 194 of interlock member 184. Engaging portion 206 may include taper 212. Taper 212 may engage a complementary taper on motherboard injector/ejector 114 to facilitate closure of motherboard injector/ejector. Interlock member 184 may be made of various materials, including but not limited to, ABS, polyvinyl chloride, steel, or aluminum. In one embodiment, interlock member 184 is produced as a unitary molded piece. Left and right interlock members 184 may be the same or different.

FIGS. 13–16 depict interlock member 184 and motherboard injector/ejector 114 on one side of a motherboard assembly 110 during installation and removal of motherboard assembly 110 and side panel assembly 106. It will be understood that an interlock mechanism on the other side of the motherboard assembly (e.g., as shown in FIGS. 9 and 10) may operate in a similar manner.

Figure 13:
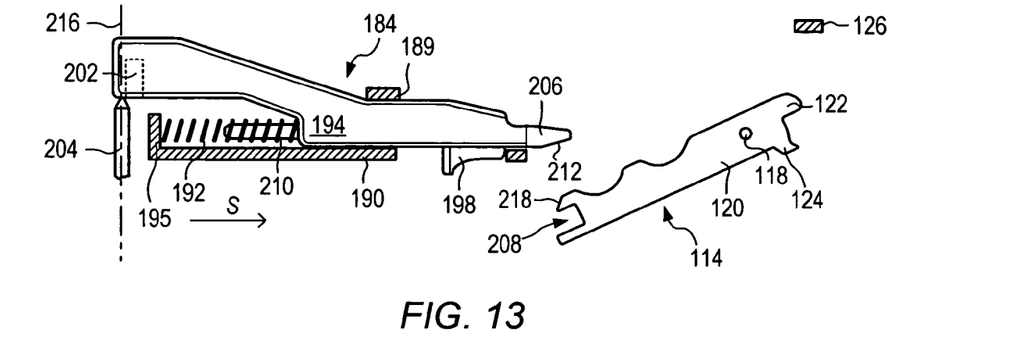
FIG. 13 depicts an interlock member and a motherboard injector/ejector before installation of the motherboard.

Prior to installation of motherboard assembly 110, motherboard injector/ejectors 114 may be biased into an open position by torsion springs 125, as shown in FIG. 13. When motherboard injector/ejectors 114 are in an open position, interlock members 184 may be biased by compression springs 192 in the direction of arrow S (i.e., toward the lateral sides of motherboard 102) such that the interlock members are held against a stop on motherboard support 112. At this point, if side panel assembly 106 is brought up to receptacle 108 on motherboard 102, holes 202 on interlock members 184 will be offset (i.e., outboard) from axes 216 of lock pins 204 on side panel assembly 106. Because holes 202 are not aligned with lock pins 204, lock pins 204 will contact the front faces of interlock members 184 (see dashed lines representing lock pins 204), blocking further advancement of side panel assembly 106. Blocking side panel assembly 106 from fully advancing against motherboard assembly 110 may prevent a user from injecting the side panel assembly 106 on motherboard assembly 110. For example, in some embodiments, side panel injector/ejectors 134 may be inoperable when side panel assembly 106 is not fully advanced against motherboard assembly 110 because projecting rims 150 on side panel injector/ejectors 134 (shown in FIGS. 5–7) cannot reach hooks 172 on receptacle bracket 168 (shown in FIG. 8). In other embodiments, side panel injector/ejectors 134 may be able to reach hooks 172 on receptacle bracket 168, but the user may not be able to inject side panel assembly 106 because lock pins 204 are not receivable in holes 202.

Figure 14:
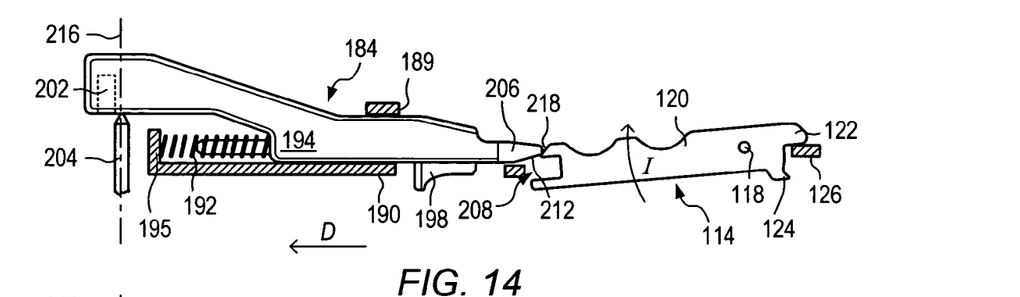
FIG. 14 depicts an interlock member and a motherboard injector/ejector during installation of the motherboard.

Referring to FIG. 14, to inject motherboard assembly 110 into chassis 104, a user may advance motherboard assembly 110 into chassis 104 until inject portions 122 of motherboard injector/ejectors 114 are past projections 126 on chassis 104. The user may then rotate motherboard injector/ejectors 114 in the direction of arrow I such that inject portions 122 engage projections 126. Engagement of inject portions 122 with projections 126 may force motherboard assembly 110 forward to inject motherboard assembly 110 into chassis 104. As motherboard injector/ejectors 114 are rotated in the direction of arrow I, tapers 218 on motherboard injector/ejectors 114 may slide across complementary tapers 212 on interlock members 184. Interlock members 184 may deflect in the direction of arrow D. As shown in FIG. 14, holes 202 may deflect in the direction of arrow D past a point of alignment with axes 216 of lock pins 204. Non-alignment of holes 202 and lock pins 204 (the offset between the holes and lock pins being in opposite direction from that shown in FIG. 13) may prevent a user from injecting side panel assembly 106 when motherboard injectors/ejectors 114 have been moved only part way to a closed position.

Figure 15:
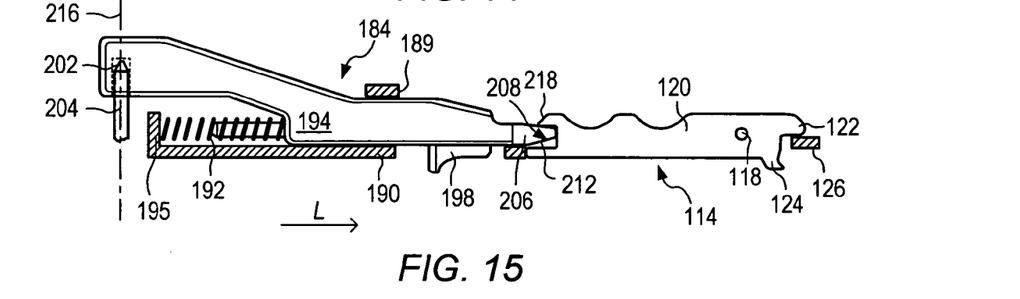
FIG. 15 depicts an interlock member and a motherboard injector/ejector when the motherboard and side panel assembly are in an installed position.

Referring to FIG. 15, motherboard injector/ejectors 114 may be rotated until motherboard assembly 110 is fully inserted into chassis 104 (e.g., mating connectors on motherboard 102 and a backplane are coupled). Motherboard injector/ejectors 114 may reach a closed position. Compression springs 192 may urge interlock members 184 in the direction of arrow L such that engaging portions 206 of interlock members 184 enter into notches 208 on motherboard injector/ejectors 114. When engaging portions 206 are in notches 208, holes 202 on side panel assembly 106 may align with axes 216 of lock pins 204 on side panel assembly 106. At this point, the user may bring side panel assembly 106 up against motherboard assembly 110. Because holes 202 are aligned with lock pins 204, lock pins 204 may enter holes 202, allowing side panel assembly 106 to fully advance against motherboard assembly 110. The user may operate side panel injector/ejectors 134 to inject side panel assembly 106 onto motherboard assembly 110.

As may be seen in FIGS. 13 and 14, interlock mechanisms 180 may prevent a user from installing a side panel assembly 106 when motherboard assembly 110 is not installed (e.g., as shown in FIG. 13) or only partially installed (e.g., as shown in FIG. 14) in chassis 104. Thus, interlock mechanisms 180 may help ensure that motherboard assembly 110 is fully installed before side panel assembly 106 is installed.

With interlock members 184 in the position shown in FIG. 15, engagement of interlock members 184 in notches 208 may inhibit a user from operating motherboard injector/ejectors 114 to eject motherboard assembly 110. In addition, as long as side panel assembly 106 is installed on motherboard assembly 110 (and thus lock pins 204 are in holes 202), a user may be inhibited from operating releases 198 to release motherboard injector/ejectors 114. Thus, interlock mechanisms 180 may ensure that side panel assembly 106 is removed from motherboard assembly 110 before motherboard assembly 110 is removed from chassis 104.

Figure 16:
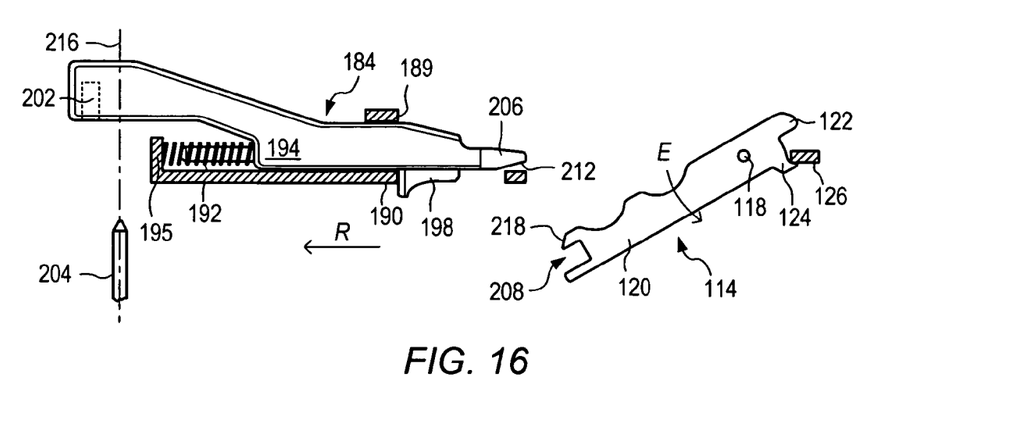
FIG. 16 depicts an interlock member and a motherboard injector/ejector after release of an interlock mechanism.

Referring to FIG. 16, to remove motherboard assembly 110 from chassis 104, a user may actuate release 198 by applying pressure to the release with a thumb or finger.

Interlock member 184 may move in the direction of arrow R. When engaging portions 206 of interlock members 184 clear notches 208, motherboard injector/ejectors 114 may rotate under the spring force of torsion spring 125 (shown in FIG. 3) in the direction of arrow E. Eject portions 124 of motherboard injector/ejectors 114 may engage projections 126 on chassis 104. A user may grasp motherboard injector/ejectors 114 and continue rotation in the direction of arrow E. Motherboard injector/ejectors 114 may be actuated to force motherboard assembly 110 out of chassis 104 until mating connector parts on motherboard 102 and the chassis (e.g., on a backplane) have decoupled. After the connector parts have decoupled, motherboard assembly 110 may be pulled out chassis 104.

In some embodiments, an interlock system may be used to ensure that circuit boards of a computer system are installed into and removed from a chassis in a desired order. The chassis of the computer system may accommodate a plurality of motherboard assemblies in a parallel spaced relationship. In one embodiment, the computer system includes three motherboard assemblies as shown in FIG. 1. Each of the motherboard assemblies may include left and right motherboard injector/ejectors and left and right interlock mechanisms as shown, for example, in FIG. 10. The computer system may also include a side panel assembly as shown, for example, in FIG. 1. The side panel assembly may couple with receptacles on each of the motherboards.

In this embodiment, a user may first install the motherboard assemblies in the chassis using motherboard injector/ejectors. After all motherboard assemblies have been fully installed, the user may attempt to use the side panel injector/ejectors to install the side panel assembly on all motherboard assemblies simultaneously.

If the user has fully installed all the motherboard assemblies (e.g., the user has closed each of motherboard injector/ejectors 114, as shown in FIG. 15), the interlock members will allow the side panel assembly to fully advance against the motherboard assemblies. Side panel injector/ejectors may be operated to inject the side panel assembly into the motherboard receptacles. If, however, the user has failed to fully install the motherboard assemblies (e.g., by failing to advance a motherboard assembly far enough to couple motherboard connector parts with corresponding backplane connector parts, or by failing to completely close one of the motherboard injector/ejectors), an interlock mechanism on that motherboard assembly may inhibit the side panel assembly from fully advancing against the motherboard assemblies (e.g., by blocking advance of lock pin 204 on side panel assembly 106, as shown in FIG. 13 or 14). With the side panel assembly only partially advanced, the side panel injector/ejectors may not be operable to inject the side panel assembly. When the user has addressed the problem by fully installing the motherboard assembly, the user may proceed to install the side panel assembly.

To remove one of the motherboard assemblies, the user will first remove the side panel assembly from the motherboard assemblies using the side panel injector/ejectors. If the user attempts to eject a motherboard assembly before the side panel assembly has been removed, the interlock system may inhibit operation of the motherboard injector/ejectors (e.g., by engagement of interlock members 184 in notches 208, as shown in FIG. 15). In addition, the interlock system may inhibit a user from releasing the motherboard injector/ejectors (e.g., by engagement of lock pin 204 with interlock member 184, as shown in FIG. 15).

An interlock system may reduce the risk of damage to circuit board assemblies in a computer system during installation and removal of circuit boards. For example, in the multiple motherboard embodiment described above, if one of the motherboard assemblies is only partially installed in the chassis, the receptacle on that motherboard assembly may not be vertically aligned with (e.g., directly above or below) receptacles on fully installed motherboard assemblies. If the user could install the side panel assembly with the motherboard receptacles in a misaligned condition, a side panel circuit board and/or motherboards may be bent or twisted. Similarly, if a user could operate an ejector on a motherboard assembly to force ejection of the motherboard assembly while the side panel assembly is still installed, the side panel circuit board and/or motherboards may be deformed. Excessive deformation of circuit boards may result in failures on the circuit boards, such as broken wires, solder joints, or conductive traces. In addition, deformation of the circuit boards during installation or removal may result in misalignment of mating connector parts, which may damage contacts on the connectors. By inhibiting a user from installing a side panel assembly on motherboard assemblies until all motherboard assemblies are fully installed (and their receptacles aligned), or from attempting to eject the motherboards prematurely, the risk of damage to the circuit boards and related components may be reduced.

Figure 17:
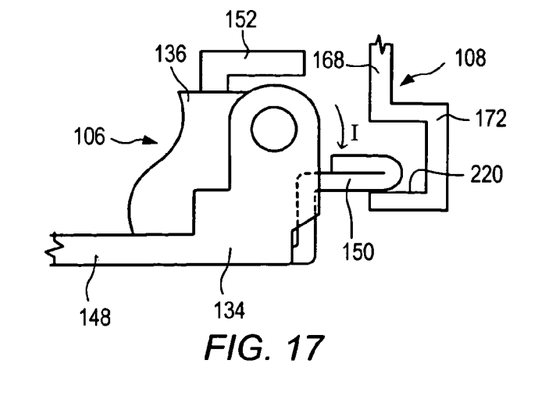
FIG. 17 depicts a top view of an injector on a side panel assembly engaging a bracket on a receptacle after injection of the side panel assembly onto a circuit board.

FIGS. 17–19 depict detail views of engagement of side panel injector/ejector 134 with receptacle bracket 168. To inject side panel assembly 106 into receptacles 108, a user may move handle portions 148 of injectors 134 toward base plate 136. Projecting rims 150 may move in the direction of arrow I on FIG. 17 to engage rearward facing surfaces 220 of hooks 172. Engagement of projecting rims 150 with hooks 172 may cause side panel assembly 106 to be drawn toward receptacle 108. Injectors 134 may be rotated until handle portions 148 of injectors 134 bottom out against base plate 136. As injectors 134 are rotated, contacts in header connector parts 142 (shown in FIG. 7) may couple with contacts in receptacle connector parts 166 (shown in FIG. 8). Latch spring 156 may couple with catches 158 to inhibit injectors 134 from rotating away from base plate 136. FIG. 17 depicts injector 134 in a closed position following injection of side panel assembly 106 into receptacle 108.

Figure 18:
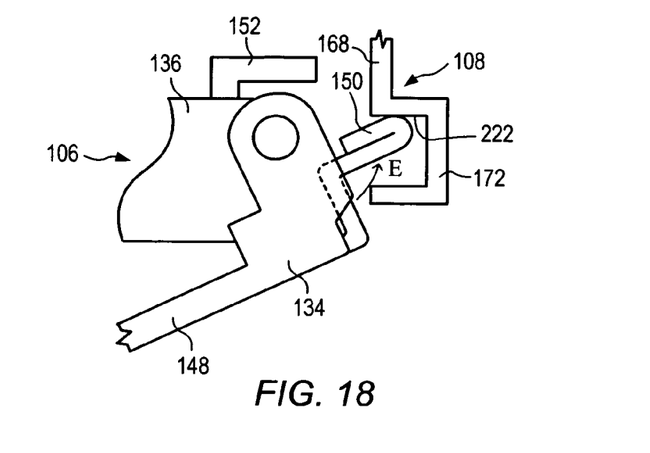
FIG. 18 depicts a top view of an injector on a side panel assembly engaging a bracket on a receptacle during ejection of the side panel assembly from a circuit board.
Figure 19:
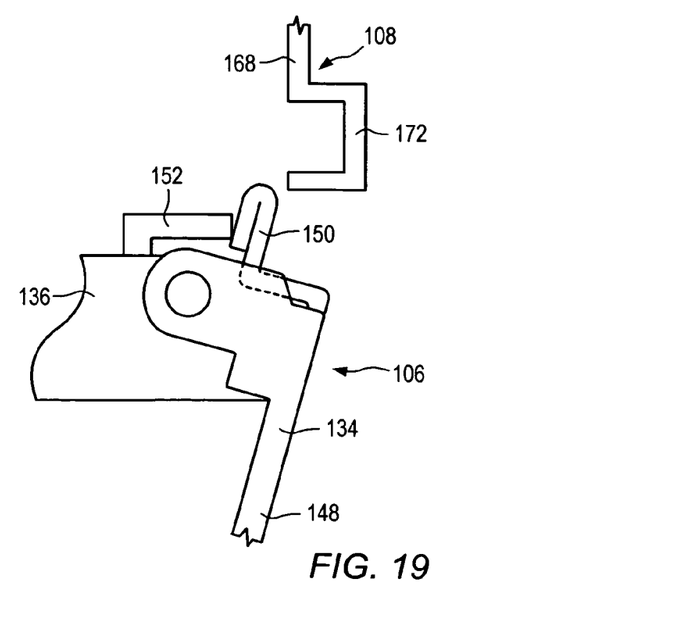
FIG. 19 depicts a top view of an injector held by a stop on a side panel assembly.

To eject side panel assembly 106 from receptacle 108, latch spring 156 may be released by operating release 160 (shown in FIG. 5). A user may rotate handle portions 148 of injectors 134 away from base plate 136. Projecting rims 150 may move in the direction of arrow E shown in FIG. 18. Projecting rims 150 may engage forward facing surfaces 222 of hooks 172, as shown in FIG. 18. Engagement of projecting rims 150 with forward facing surfaces 222 of hooks 172 may cause side panel assembly 106 to be pushed away from receptacle 108. As injectors 134 are rotated, contacts in header connector parts 142 may decouple from contacts in receptacle connector parts 166. As shown in FIG. 19, projecting rims 150 of injectors 134 may contact stops 152. Contact with stops 152 may inhibit further rotation of injectors 134.

In the embodiments depicted in FIGS. 1 and 2, one of the circuit boards to be interlocked (i.e., side panel assembly 106) is installed on, and perpendicular to, one or more other circuit boards (i.e., motherboard assembly 110). In other embodiments, each of the circuit boards to be interlocked may be separately mounted in the chassis. In addition, circuit boards to be interlocked may have spatial relationships other than perpendicular.

Figure 20:
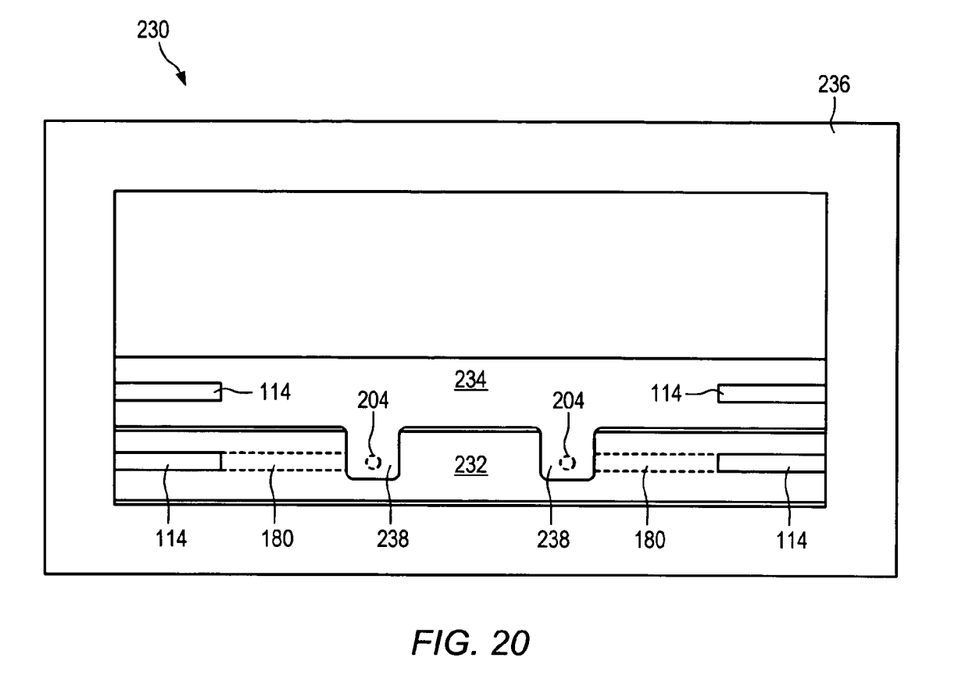
FIG. 20 depicts a schematic view of a computer system including parallel circuit board assemblies connected by an interlock system.

In an embodiment, an interlock mechanism may be used to control a sequence of installation or removal of a plurality of parallel boards mounted in a chassis. FIG. 20 depicts a schematic diagram of computer system 230 including circuit board assemblies 232, 234. Each of circuit board assemblies 232, 234 are separately mounted in chassis 236. Circuit board assembly 232 may include interlock mechanisms 180 similar to those depicted in FIGS. 9 and 10. Circuit board assembly 234 may include tabs 238. Tabs 238 may carry lock pins 204 similar to those included on side panel assembly 106 in FIG. 10. Interlock mechanisms 180 may help ensure that circuit board assembly 232 is fully installed before circuit board assembly 234 is installed. Interlock mechanisms 180 may also help ensure that circuit board assembly 234 is removed before a user attempts to eject circuit board assembly 232 from computer system 230. In one embodiment, circuit board assembly 234 is a hot-swappable unit and circuit board assembly 232 is not a hot-swappable unit.

In the context of this patent, the term "coupled" includes direct coupling or indirect coupling (e.g., with one or more intervening elements). For example, an lock pin and a motherboard and a motherboard injector/ejector may be coupled by directly attaching the motherboard injector/ejector to the motherboard or by attaching each of the motherboard and the motherboard injector/ejector to one or more intervening elements (e.g., to a motherboard support).

While the present invention has been described with reference to particular embodiments, it will be understood that the embodiments are illustrative and that the invention scope is not so limited. Any variations, modifications, additions, and improvements to the embodiments described are possible. These variations, modifications, additions, and improvements may fall within the scope of the inventions as detailed within the following claims. For example, when the terms "vertical," "horizontal" "upward", "downward," "under", "over," "left," or "right" are used in the claims, they are to be understood to relate to the Figures as illustrated. However, the device may be turned at an angle to the horizontal or inverted with the quoted terms referring to the altered orientation.

What is claimed is:

1. An interlock mechanism, comprising an interlock member configurable to engage a portion of a first circuit board assembly and a portion of a second circuit board assembly, the interlock member being positionable to inhibit installation of the second circuit board assembly onto the first circuit board assembly unless the first circuit board assembly is substantially fully installed in a chassis and to inhibit removal of the first circuit board assembly from the chassis when the second circuit board assembly is installed on the first circuit board assembly.

2. The interlock mechanism of claim 1, wherein the interlock member is positionable to inhibit use of a first injector/ejector to eject the first circuit board assembly from the chassis when the second circuit board assembly is installed on the first circuit board assembly and to inhibit use of a second injector/ejector to inject the second circuit board assembly onto the first circuit board assembly unless the first injector/ejector is in a closed position.

3. The interlock mechanism of claim 2, further comprising a release operable to disengage the interlock member from the first injector/ejector when the second circuit board assembly is not installed on the first circuit board assembly.

4. The interlock mechanism of claim 2, further comprising:
a resilient member configurable to bias the interlock member into engagement with the first injector/ejector, and
a release operable to disengage the interlock member from the first injector/ejector when the second circuit board is not installed on the first circuit board assembly.

5. The interlock mechanism of claim 1, wherein the interlock member comprises a hole configurable to receive a pin on the second circuit board assembly.

6. A circuit board assembly, comprising:
a first circuit board; and
a first injector/ejector coupled to the first circuit board, the first injector/ejector being configurable to inject the first circuit board into a chassis and eject the first circuit board from the chassis; and
an interlock member configurable to engage the first injector/ejector when the first circuit board assembly is substantially fully inserted in the chassis to inhibit removal of the first circuit board assembly from the chassis, the interlock member being unreleasable from the first injector/ejector when a second circuit board assembly is inserted in the chassis to a predetermined position, the interlock member being releasable from the first injector/ejector device when the second circuit board assembly is not inserted in the chassis to the predetermined position.

7. The circuit board assembly of claim 6, wherein the interlock member is configured to is allow installation of the second circuit board assembly in the chassis when the first circuit board assembly is substantially fully installed in the chassis, wherein the interlock member is configured to inhibit installation of the second circuit board assembly into the chassis when the first circuit board is not substantially fully installed in the chassis.

8. The circuit board assembly of claim 6, wherein the interlock member comprises a release portion, wherein the interlock member is configured to disengage from the injector/ejector when the release portion is operated.

9. The circuit board assembly of claim 6, further comprising a resilient member configured to move the first injector/ejector out of a closed position when the interlock member is disengaged from the first injector/ejector.

10. The circuit board assembly of claim 6, wherein the interlock member comprises a hole configured to receive a pin on the second circuit board assembly when the first circuit board assembly is substantially fully installed in the chassis, wherein the hole is configured to not receive the pin on the second circuit board assembly when the first circuit board assembly is not substantially fully installed in the chassis.

11. The circuit board assembly of claim 6, wherein the interlock member is configured to engage the first injector/ejector when the first injector/ejector is in a closed position such that the hole is configured to receive the pin on the second circuit board assembly.

12. A system, comprising:
a first circuit board assembly comprising:
a first circuit board; and
a first pair of injector/ejectors coupled to the first circuit board, the first pair of injector/ejectors being operable to eject the first circuit board assembly from a chassis;
a second circuit board assembly comprising a second circuit board; and
a pair of interlock members coupled to one of the circuit board assemblies, the interlock members being configurable to inhibit use of the second injector/ejector to inject the second circuit board assembly onto the first circuit board assembly unless the first circuit board is substantially fully installed in the chassis, the pair of interlock members being configurable to inhibit use of the first pair of injector/ejectors to eject the first circuit board assembly when the second circuit board assembly is installed on the first circuit board assembly.

13. The system of claim 12, wherein the first circuit board assembly is a motherboard assembly, and wherein the second circuit board assembly is a side panel assembly.

14. The system of claim 12, wherein the interlock members are releasable from the first pair of injector/ejectors when the second circuit board assembly is not installed on the first circuit board assembly, wherein release of the pair of interlock members allows a user to operate the pair of first injector/ejectors to eject the first circuit board assembly from the chassis.

15. The system of claim 12, wherein each of the first pair of injector/ejectors comprises a handle, wherein the handles are inaccessible to a user when the first circuit board assembly is installed in the chassis and the second circuit board assembly is installed on the first circuit board assembly.

16. The system of claim 12, wherein the second circuit board assembly comprises a pair of pins, wherein the interlock members are configured to block the pins from advancing toward the first circuit board assembly during installation of the second circuit board assembly unless the first circuit board assembly is substantially fully installed in the chassis.

17. The system of claim 12, wherein second circuit board assembly comprises a second pair of injector/ejectors, wherein the second pair of injector/ejectors is configurable to inject the second circuit board assembly onto the first circuit board assembly when the first pair of injector/ejectors are in a closed position.

18. The system of claim 12, wherein the second circuit board assembly comprises a pair of pins, wherein the interlock members are configured to inhibit the second pair of injector/ejectors from engaging the first circuit board assembly unless the first circuit board assembly is substantially fully installed in the chassis.

19. The system of claim 12, further comprising a third circuit board assembly, wherein the second circuit board assembly is configured to couple with the first and third circuit board assemblies at the same time.

20. The system of claim 19, wherein the third circuit board assembly comprises a third pair of injector/ejectors and a second pair of interlock members, wherein the second pair of interlock members is configurable to inhibit use of the second pair of injector/ejectors to inject the second circuit board assembly onto the third circuit board assembly unless the third circuit board assembly is substantially fully installed in the chassis, the second pair of interlock members being configurable to inhibit use of the third pair of injector/ejectors to eject the third circuit board assembly when the second circuit board assembly is substantially fully installed on the third circuit board assembly.

* * * * *